United States Patent
Dionne et al.

(10) Patent No.: US 9,667,408 B2
(45) Date of Patent: *May 30, 2017

(54) COMMUNICATION SYSTEMS AND METHODS FOR DISTRIBUTED POWER SYSTEM MEASUREMENT

(71) Applicant: Smart Energy Instruments Inc., Oakville (CA)

(72) Inventors: Donald Jeffrey Dionne, Oakville (CA); Jennifer Marie McCann, Oakville (CA)

(73) Assignee: Smart Energy Instruments Inc., Oakville (CA)

(*) Notice: Subject to any disclaimer, the term of this patent is extended or adjusted under 35 U.S.C. 154(b) by 0 days.

This patent is subject to a terminal disclaimer.

(21) Appl. No.: 15/178,600

(22) Filed: Jun. 10, 2016

(65) Prior Publication Data

US 2016/0285616 A1 Sep. 29, 2016

Related U.S. Application Data

(63) Continuation of application No. 14/761,989, filed as application No. PCT/CA2013/050928 on Dec. 3, 2013, now Pat. No. 9,369,269.

(51) Int. Cl.
*H04L 7/033* (2006.01)
*H04L 7/00* (2006.01)
(Continued)

(52) U.S. Cl.
CPC .......... *H04L 7/033* (2013.01); *G01R 19/2513* (2013.01); *H04J 3/0664* (2013.01);
(Continued)

(58) Field of Classification Search
CPC ....... H04L 7/033; H04L 7/0012; H04L 12/66; H04L 65/1069; G01R 19/2513;
(Continued)

(56) References Cited

U.S. PATENT DOCUMENTS 4,747,041 A 5/1988 Engel et al.
6,408,351 B1* 6/2002 Hamdi ................ G06F 13/4068
455/557

(Continued)

FOREIGN PATENT DOCUMENTS

WO 2013001355 1/2013

OTHER PUBLICATIONS

WIPO, International Search Report and Written Opinion relating to application No. PCT/CA2013/050928, dated Aug. 21, 2014.

*Primary Examiner* — Syed Haider
(74) *Attorney, Agent, or Firm* — Rowand LLP (57) ABSTRACT

Described are methods, devices and systems for communicating data measurements from a sampling device to a remote master device in a distributed power measurement system using high-speed isochronous data links. The sampling device receives a time-stamp packet from the master device over the isochronous data link, the time-stamp packet containing a sequence number of the time-stamp packet, and the sampling device starts a counter clocked by a local clock signal to determine an offset time since receipt of the time-stamp packet. The sampling device obtains power system data and generates and transmits framed output data to the remote master device over the isochronous data link. The framed output data includes the sequence number, the offset time, and a data payload that includes the power system data.

22 Claims, 4 Drawing Sheets

(51) Int. Cl.
*G01R 19/25* (2006.01)
*H04J 3/06* (2006.01)
*H04Q 9/00* (2006.01)
*H02J 13/00* (2006.01)

(52) U.S. Cl.
CPC ............ *H04L 7/0012* (2013.01); *H04Q 9/00* (2013.01); *H02J 13/0062* (2013.01); *Y02E 60/728* (2013.01); *Y02E 60/74* (2013.01); *Y02E 60/7838* (2013.01); *Y04S 10/265* (2013.01); *Y04S 10/30* (2013.01); *Y04S 40/124* (2013.01)

(58) Field of Classification Search
CPC ...... H04J 3/0664; H04Q 9/00; H02J 13/0062; Y04S 10/265; Y04S 10/30; Y04S 40/124; Y02E 60/728; Y02E 60/74; Y02E 60/7838
See application file for complete search history.

(56) References Cited

U.S. PATENT DOCUMENTS

| | | | |
|---|---|---|---|
| 2004/0190666 A1* | 9/2004 | Aiello | H04L 27/3405 375/354 |
| 2005/0190739 A1* | 9/2005 | Sparrell | H04B 7/2659 370/347 |
| 2005/0220240 A1* | 10/2005 | Lesso | G06F 5/06 375/372 |
| 2011/0200048 A1* | 8/2011 | Thi | H04B 3/23 370/392 |
| 2012/0200284 A1 | 8/2012 | Dionne | |

* cited by examiner

COMMUNICATION SYSTEMS AND METHODS FOR DISTRIBUTED POWER SYSTEM MEASUREMENT

CROSS-REFERENCE TO RELATED APPLICATIONS

The present application is a continuation of U.S. patent application Ser. No. 14/761,989 filed Dec. 3, 2013, and granted as U.S. Pat. No. 9,369,269, the contents of which are hereby incorporated by reference.

FIELD

The present application generally relates to power measurement and to communication systems and methods for use in transmitting data in a distributed power measurement system.

BACKGROUND

Modern power systems rely upon fast and accurate phasor measurements from a plurality of distributed nodes in the system. In some cases, it is desirable to make phase comparisons between nodes that are located large distances apart. Accordingly, accurately timing measurements and correlating measurements from disparate parts of the system is a challenge.

It would be advantageous to provide for power signal measurement/sampling that produces fast and accurate measurements that can be correlated in time, while reducing component cost in the measurement devices.

BRIEF DESCRIPTION OF THE DRAWINGS

Reference will now be made, by way of example, to the accompanying drawings, which show example embodiments of the present application, and in which.

DESCRIPTION OF EXAMPLE EMBODIMENTS

In one aspect, the present application discloses a sampling device for use in a distributed power measurement system. The sampling device includes a link interface to send and receive data with a remote master device using high-speed isochronous data links; a clock circuit to generate a local clock signal; a data storage element to store a sequence number of a time-stamp packet received from the remote master; a counter clocked by the local clock signal to determine an offset time since receipt of the time-stamp packet; and a framing controller to generate framed output data for transmission to the remote master device over the isochronous data link, wherein the framed output data includes the sequence number, the offset time, and a data payload.

In another aspect, the present application discloses a distributed power measurement system that includes at least one of the sampling devices and a master device. The master device is connected to each of the at least one sampling devices via the high-speed isochronous data links to send the time-stamp packets on a periodic basis and to receive data payloads with associated sequence numbers and offset times. The master device includes memory storing a plurality of time-stamp and sequence number pairs and a processor to determine the absolute time associated with data samples in the data payload.

In a further aspect, the present application discloses a method to communicate data measurements from a sampling device to a remote master device in a distributed power measurement system using high-speed isochronous data links. The method includes receiving, at the sampling device, a time-stamp packet from the master device over the isochronous data link, the time-stamp packet containing a sequence number of the time-stamp packet; starting a counter clocked by a local clock signal to determine an offset time since receipt of the time-stamp packet; obtaining power system data; and generating and transmitting framed output data to the remote master device over the isochronous data link, wherein the framed output data includes the sequence number, the offset time, and a data payload that includes the power system data.

In yet another aspect, the present application includes non-transitory computer-readable media containing processor-executable instructions for carrying out one or more of the methods described herein.

Other aspects and features of the present application will be understood by those of ordinary skill in the art from a review of the following description of examples in conjunction with the accompanying figures.

One of the techniques for improving power system reliability and stability is to provide for accurate high-speed phasor measurement at various nodes in the power system network. The measurements are carried out by measurement devices (also referred to herein as "sampling devices") distributed through the network. An important feature of phasor measurement systems is timing accuracy, since it is desirable to be able to accurately and quickly correlate and compare measurements taken at the same time at different nodes in the system and, if necessary, implement corrective action. At times, it may be desirable to make near-real-time relative phase determinations between nodes of the system that may be tens of kilometers apart.

Figure 1:
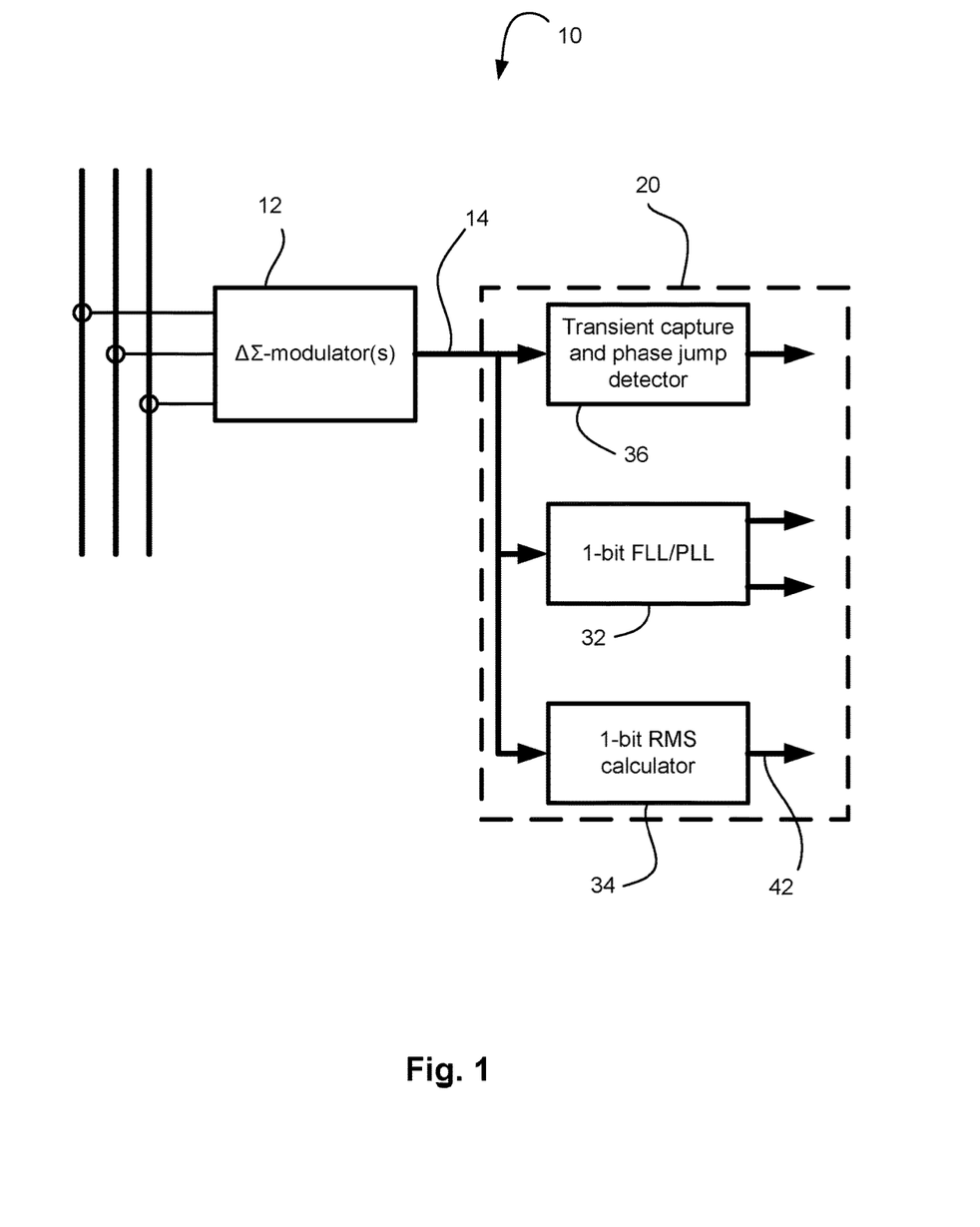
FIG. 1 shows a block diagram of an example of a power measurement device.

An example power measurement device is described in US Patent Publication No. 2012-0200284-A1 to Dionne, entitled "Power Measurement Device", the contents of which are hereby incorporated by reference. Reference is now made to FIG. 1, which shows a simplified block diagram of a power measurement device 10. The device 10 includes a 1-bit Delta-Sigma Modulator (DSM) 12 for measuring the power quantity (voltage and/or current on one of the phases) and producing a 1-bit DSM bitstream 14. It will be understood that conventional delta-sigma converters employ a low-pass filter at the output to remove the high frequency shaped quantization noise components of the delta-sigma modulation when converting the bitstream to multi-bit data. In some embodiments, the device 10 does not employ such low pass filtering but, instead, retains the high frequency components for as least some of the signal processing operations. As noted above, for simplicity a single DSM 12 is illustrated in FIG. 1. Some implementations may have two or more delta-sigma modulators for measuring current and voltage signals on one or more phases. In the case of a three-phase three-wire system, six DSMs may be used so as to measure current and voltage on all three phases. Similarly, in the case of a three-phase four-wire system, eight delta-sigma modulators may be used so as to measure current and voltage on all three phases and the neutral.

In this example, the device 10 includes a signal processor 20. The signal processor 20 receives the bitstream 14 and performs signal analysis and measurements. In particular, the signal processor 20 is implemented to operate on the 1-bit DSM bitstream 14 directly. The signal processor 20 produces high accuracy synchrophasor measurements of the power system fundamental. It may also selectively detect and measure subgroup harmonics present (selected by power content), perform transient detection, and perform both single bit and multiple bit waveform capture. In this example, the signal processor 20 includes a 1-bit dual frequency locked-loop (FLL) and phase-locked-loop (PLL) 32 architecture. The signal processor 20 also includes a transient capture and phase jump detection component 36. The transient capture and phase jump detection component 36 is configured to detect possible transients in the bitstream 14. The signal processor 20 further includes a 1-bit RMS calculator 34. The RMS calculator 34 calculates the root-mean-square value of the input DSM bitstream, thereby producing an RMS signal 42.

As noted above, timing accuracy is important in connection with power system measurements. A high-accuracy external time base, like a GPS signal or IRIG-B signal, may be used to derive a highly-accurate local clock signal for performing delta-sigma sampling and any signal processing. Example methods and devices for correcting clock signals are described in PCT patent application serial no. PCT/CA2013/050912, to Dionne et al., filed Nov. 28, 2013, the contents of which are hereby incorporated by reference.

The power measurement device 10 shown in FIG. 1 is one example of a power measurement device. In many systems it would be too costly to provide for full or even partial signal processing capabilities in every power measurement device. It may also be too costly to incorporate a GPS-corrected direct-digital synthesizer (DDS) in every power measurement device.

Accordingly, in some systems, at least some of the distributed sampling devices of the power measurement system may lack signal processing capabilities and may relay the sampled data to another node in the system. In addition, at least some of the sampling devices may rely upon a GPS-corrected clock signal or time value distributed by another device in the network in order to indicate the time at which the relayed data was sampled.

In one implementation, the present application describes a power measurement system in which a designated master device receives delta-sigma modulated (DSM) power system sampled data (bitstreams) from one or more slave sampling devices in the network. The master device receives timing data from the slave devices that allows the master device to realign the received DSM data. Because it is sampled at high speed, such that the quantized sampling time has negligible effect, the master may realign the data by inserting a simply delay of an integer multiple of the sampling time.

In order to implement the distributed power measurement system and maintain timing reliability, in one aspect the present application provides for a high-speed isochronous data link between a master device and a slave device. The isochronous data link may be used for distributing time data, such as periodic time-stamp packets. For example, in one embodiment the master contains a GPS-locked highly-accurate clock and distributes a periodic time stamp through the system. In other embodiments, the GPS-locked time source may be located in one of the slave devices and is periodically distributed to the master (and, possibly, other slave devices). In the embodiments described below it is presumed that the GPS-locked time source is located in and distributed by the master device, but it will be appreciated that the present description is applicable to other configurations. An external time source other than GPS may be used in some implementations.

In one example, the master device sends a time stamp with predetermined regularity. For instance, the master may send the time stamp every 1 ms. The slave device therefore receives a regular time sync packet indicating the current time at the master (plus transmission time from master to slave). Precision Time Protocol (PTP) (as defined in IEEE 1588-2008) is one example process for distributing time information to nodes of a network for synchronizing clocks, in that case using IP for transport. The PTP process also describes a mechanism for determining transit time between a master and slave in a network for the purpose of synchronizing the slave clock to a master clock. Portion of the PTP process may be incorporated into systems and process described in the present application in order to determine transit time between a master and a slave.

In many embodiments, unlike in PTP, there is no need for the slave to have a clock synchronized in time to the master clock such that it can determine an absolute time. Instead, the objective is to ensure that the slave is capable of accurately communicating the elapsed time between receipt of a master time stamp communication and the time at which a sample is taken. In some such cases, only the master device needs to know the absolute time at which samples were taken so that it can properly align data from various sources/nodes in the network. Accordingly, in such embodiments the slave device simply needs a reasonably accurate high-frequency clock signal. The high-frequency clock signal at the slave device may be derived from the high-speed isochronous link from the master in some implementations (e.g. using a phase-locked loop (PLL) for clock recovery), thereby ensuring that the master device clock signal is synched to the clock signal used in the slave device to determine the elapsed time between receipt of a master time stamp and sampling of power system data at the slave device.

To save bandwidth, the time stamp distributed by the master device may be accompanied by (or even replaced by) a much shorter sequence number. The sequence number may count the number of time-stamp packets sent by the master. In one embodiment, the time stamp is an 80-bit time stamp and the sequence number is an 8-bit identifier. The master may store a history of pairs of time stamps and corresponding sequence numbers. In one example, the master may store the most recent 16 pairs, although it will be appreciated that more or fewer may be stored depending on the needs of a given implementation. The time stamp and/or sequence number may be shorter or longer in different embodiments, depending on the specific needs of a system.

When a slave device receives a time-stamp packet from the master device, it may store the sequence number and start/restart an offset counter. The offset counter is clocked at the slave device's local clock speed which, as noted above, may be derived from the isochronous link using a PLL for clock recovery. In some cases, the slave device may use a local oscillator and may correct the oscillator signal using data recovery to determine the center of bit times on the isochronous data link. The latter approach may lead to a small mismatch between the clock of the master and the local clock at the slave device, and in such cases, a data recovery circuit ensures data is received correctly in the presence of clock slip.

The offset counter tracks time (in local clock cycles) from receipt at the slave device of the master time stamp. If there are inherent delays within the slave device between detecting a master time stamp and initiating reset of the offset counter, then that delay may be accounted for in resetting the offset counter to start from a predetermined base value. An example will be described in detail later below.

When the slave device transmits data to the master device over the high-speed isochronous link, the slave device inserts the most-recently received sequence number and the value in the offset counter into the frame header of the data.

The offset value may be a measurement of the time elapsed between receipt of the most recent sequence number and a sampling time for data being transmitted. In this case, the offset counter may be read contemporaneously with one or more of the samples being taken or on occurrence of some other event being reported in the transmission. In yet another implementation, the offset counter value indicates the time between receipt of the sequence number and transmission of the outgoing data. In some cases, a pre-calculated overage may account for the time between the sampling event and reading of the offset counter value and may be subtracted from the offset counter value such that the value placed in the outgoing transmission more accurately reflects the sample time.

At the master device, data is received over the isochronous link with an associated sequence number and offset value. From this, the master device may determine a sample time from the stored time stamp associated with the sequence number, the offset value that indicates when the sample was taken relative to receipt of the sequence number at the slave device, and a transit time for transmission of the time stamp from the master to the slave. This transit time may be have been calculated earlier by the master by sending a request message to the slave device and receiving a response message with an offset value. The offset value represents the delay between receiving the request message and sending the response message. The round trip time less the offset value gives the transit time there and back, provided the offset value reflects the time between receipt of the message and actual transmission of the response; it will be understood that various clock cycles may be added to or subtracted from the offset counter value to determine the actual offset value based on known propagation delays within the slave device. Presuming that the transit time is the same in both directions for the link, the master device may then determine the transit time from master to slave. The determination of transit time may be repeated periodically to account for any changes in link characteristics.

In some embodiments, data transmitted over the isochronous data link may be encoded. In some instances, 8b/10b encoding may be used to achieve DC-balance and allow for clock recovery. DC-balance allows for use of transformers and other galvanic isolation techniques within the isochronous link path, which can be advantageous when operating within a power system. Other coding schemes may be used in other embodiments.

Figure 2:
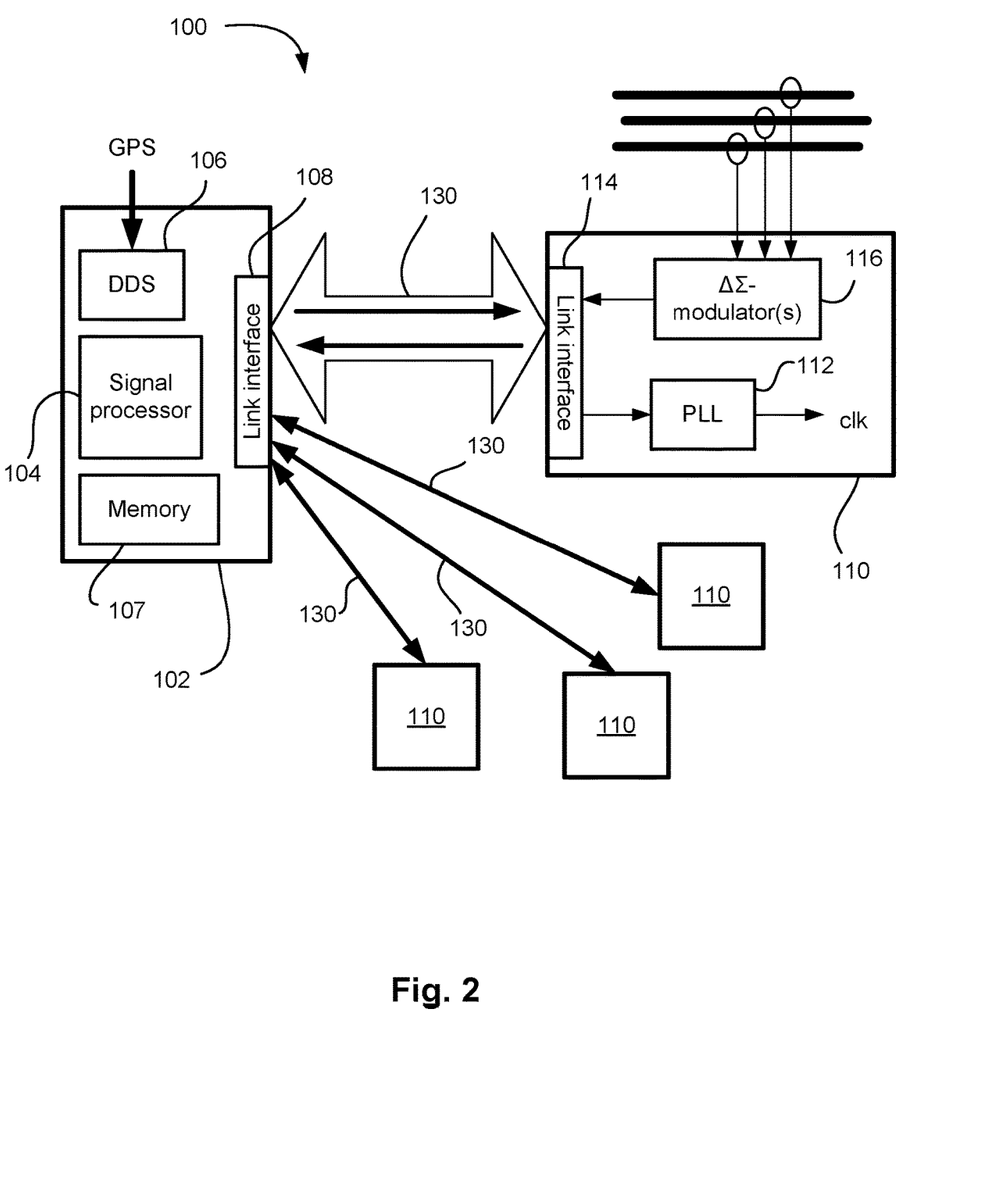
FIG. 2 shows a block diagram of a distributed power sampling system.

Reference is now made to FIG. 2, which shows a simplified block diagram of an example power measurement system 100. The system 100 includes a master device 102, which in this example includes signal processor 104, GPS-locked DDS 106, memory 107, and link interface 108. The system 100 includes a plurality of slave devices 110, i.e. sampling devices. The slave devices 110 include a PLL 112 for clock recovery, link interface 114, and delta-sigma modulators (DSM) 116 (one illustrated) for sampling power system signals and generating high-frequency DSM bitstreams.

The master device 102 and each slave device 110 communicate over a dedicated isochronous link 130. Each isochronous link 130 may include an isochronous link or channel from master-to-slave and from slave-to-master. It will be understood that the isochronous links 130 to various slave devices 110 may operate over at least some of the same physical links. Galvanic isolation circuitry and other such details are not illustrated. The physical links may include optical fiber, twisted pair, or other suitable media for a given environment.

In one embodiment, the isochronous link 130 operates at 125 Mbps or higher. The delta-sigma modulation of the power system signal by the DSM 116 produces a 12.5 Mbps bitstream of delta-sigma modulated data. The slave device 110 may buffer the delta-sigma modulated data and regularly package and send it to the master device 102 in data frames time stamped with the most-recent sequence number and the current offset value. The master device 102 extracts the delta-sigma modulated data and determines the time at which the sampling occurred from the sequence number, the associated time stamp and sequence pair stored in memory 107, a pre-measured transit time stored in memory 107, and the offset value extracted from the data frame.

In some embodiments the slave device 110 includes a plurality of DMS 116 for generating delta-sigma bitstreams each representing the power system signal (current or voltage) for one phase of a multi-phase system. Accordingly, the slave device 110, and in particularly the link interface 114, may package delta-sigma bitstream data for multiple channels in one data frame.

In one specific example, 4 channels of DSM data may be packaged together in a data frame. If 64 samples of each channel are included per frame, then the data frame may have a payload length of 32 words (64*4 channels/8). With 8 additional words of framing overhead, a frame length for data transmission may be 40 words. If the isochronous link operates at 125 Mbps and uses 8b/10b encoding, then the word transmission rate is $12.5 \times 10^6$ (i.e. 80 ns per word). At 80 ns per word, the 40-word frame duration is 3.2 µs. If the DSM 116 produces a delta-sigma modulated bitstream of samples at 12.5 Mbps, then the 64 samples occur over the course of 5.12 µs of sampling. Thus, the speed of the isochronous link is sufficiently fast to enable transmission of 4 channels of data with an inter-data-frame gap of 5.12 µs−3.2 µs=1.92 µs, and provides a link bandwidth usage of 62.5%. The inter-data-frame gap allows the slave device 110 time to respond to other register read or configuration commands from the master, if needed. It will be understood that other payload lengths, framing overhead, encoding schemes, sampling speeds, link speeds, or number of channels may be used in other embodiments.

Figure 3:
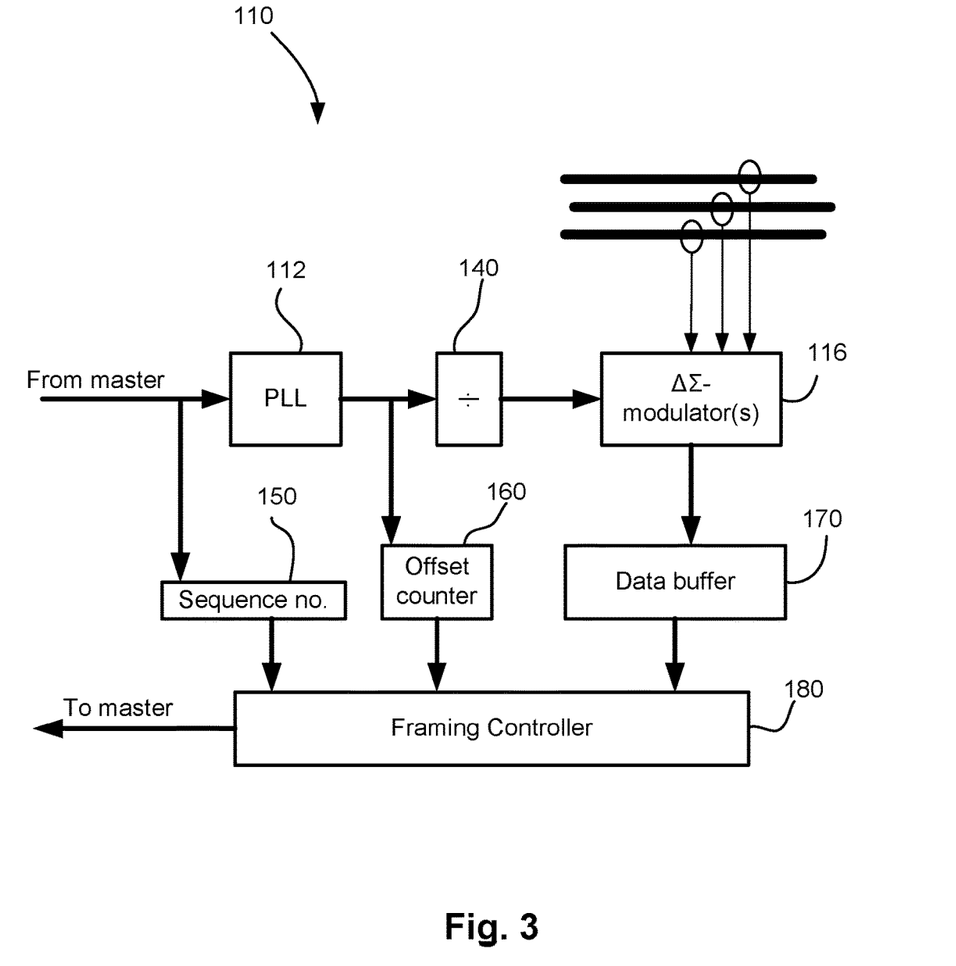
FIG. 3 shows a block diagram of an example slave device for sampling power system signals.

Reference is now made to FIG. 3, which shows one example block diagram of a slave device 110 for power signal measurement. The slave device 110, i.e. sampling device, in this example, includes the PLL 112 for clock recovery from the isochronous data link from the remote master device. In this example, the PLL 112 outputs a clock signal at the same frequency as the isochronous bit rate on the link, which in this illustration is 125 MHz. In other examples, the PLL 112 may generate a faster or slower clock signal for the slave device 110 than is found on the isochronous link.

In this example slave device 110, the generated clock signal is input to a frequency divider 140 to produce a second clock signal to drive sampling of the power signal(s). A delta-sigma modulator 116 may be clocked by the second clock signal and may output a delta-sigma bitstream of sample data representing voltage or current signals on the power system. The output bitstream may be a 12.5 Mbps bitstream in one example.

The slave device 110 further includes data storage elements for storing values, such as a sequence number register 150, an offset counter 160, and a data buffer 170. In different implementations these data storage elements may be implemented by solid state registers, random access memory, or any other digital storage device.

The sequence number register 150 stores the sequence number most-recently received by the slave device 110 in a time-stamp message sent by the master device (or other source of time distribution). The sequence number register 150 overwrites the sequence number stored therein when a new time stamp message is received.

The offset counter 160 is clocked (in this example) at the clock signal generated by the PLL 112. In some cases, the offset counter 160 may be incremented at a faster or slower rate than the isochronous link, depending on implementation details, provided that the master device is able to determine the time represented by an offset value. That is, the master device must know the speed at which the offset counter increments so that it may determine from the offset value when samples were taken by the slave device 110.

The data buffer 170 stores bitstream data from the delta-sigma modulator 116 prior to it being packaged for transmission to the master device.

The slave device 110 further includes a framing controller 180 for managing generation of the output framed data for transmission on the isochronous link to the master device. The framing controller 180 packages delta-sigma bitstream data from the data buffer 170 (there may be multiple buffers for multiple channels of data sampling) as the payload of a defined frame structure. Within predefined fields of the frame structure, the framing controller 180 inserts the sequence number read from the sequence number register 150 and the offset value read from the offset counter 160. Further details regarding handing of the offset value in some embodiments are provided below.

In some embodiments, the slave device 110 does not include the PLL 112 for clock recovery. Instead, the slave device 110 may have its own local oscillator for generating clock signals and it may perform data recovery on the isochronous link. Without using actual PLL hardware, the slave device 110 may try to manage its clock based on the bit framing of the isochronous link from the master device. There may be some clock slippage between the local clock and the clock in the master device, but the clock slip may be negligible in some implementations.

Figure 4:
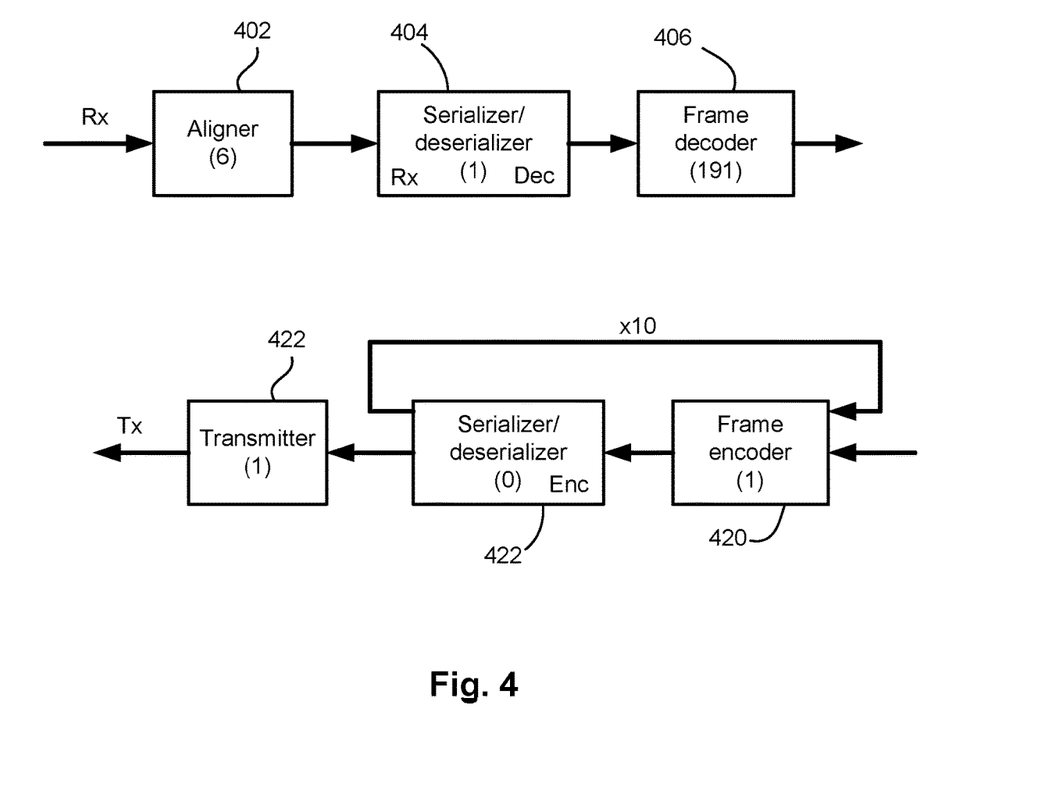
FIG. 4 shows an example diagram showing receive path and transmit path delays in an example sampling device.

Reference is now made to FIG. 4, which shows an example diagram for pre-determining the number of clock cycles to be added to or subtracted from an offset counter.

In this example, the receive path at the sampling device for a transmission from the master device includes an aligner 402, a serializer/deserializer 404, and a frame decoder 406. The aligner 402 accounts for 6 clock cycles of delay. The serializer/deserializer, which may include both a receive component and a decoder component, accounts for 1 clock cycle of delay. The frame decoder 406 results in 191 clock cycles of delay (based on the frame length for a time-stamp packet in this embodiment). Thus the total receive path delay is 198 cycles.

Accordingly, in one embodiment, the offset counter is preloaded with a binary value of 198 when receipt of a time-stamp packet is detected following decoding of the frame.

In some cases, the delay in the transmit path may also be needed. In one instance, the transmit path delay is important so as to be able to add it to the read value of the offset counter (or pre-load it into the counter in addition to the 198 cycles for the receive path) in order to account for the overall propagation delay within the sampling device. For example, if the master device is measuring transmit time from master to slave, then the overall propagation delay between receipt of a request message and transmission of the response is needed in the offset value. If the offset value is read prior to actual transmission (since it must be encoded and transmitted), then the delay attributable to the transmit path for encoding and transmission is added to the offset value (or pre-added to the counter).

In one example the transmit path includes a frame encoder 420, a serializer/deserializer encoder 422 with feedback, and a transmitter 424. The frame encoder 420 may account for 1 clock cycle of delay, although the feedback loop (assuming 8b/10b encoding) may lead to an overall delay of 10 cycles. The transmitter 424 adds a further 1 clock cycle of delay, for an overall total transmit path delay of 11 clock cycles in this example.

Other systems will have other propagation delays, depending on the encoding used, the frame structure, and the different decoding/encoding stages. Depending on when the offset value is read from the counter, different receive delays and/or transmit delays may be added (or pre-incorporated) into the offset value to ensure the offset value inserted in the outgoing frame accurately gives a number of clock cycles from receipt of the time-stamp packet to occurrence of a sampling event. The sampling event may be one sample of a time-synchronous series of samples, or it may be occurrence of a power system event (e.g. opening of a breaker, detection of a fault, or some other single measurement event).

It will be understood that the above-described power signal measurement system may be implemented partly in hardware and partly in software. In some embodiments, the implementation may include one or more field programmable gate arrays (FPGA). In some embodiments, the implementation may include one or more application-specific integrated circuits (ASIC). The selection of particular hardware components may be based upon cost, speed, operating environment, etc. The selection and programming of such components will be within the understanding of a person of ordinary skill in the art having regard to the detailed description provided herein.

In yet a further aspect, the present application discloses a non-transitory computer-readable medium having stored thereon computer-executable instructions which, when executed by a processor, configure the processor to execute any one or more of the processes described above.

Certain adaptations and modifications of the described embodiments can be made. Therefore, the above-discussed embodiments are considered to be illustrative and not restrictive.

What is claimed is:

1. A sampling device for use in a distributed power measurement system, the sampling device comprising:
    a delta-sigma modulator for sampling a power system quantity to generate a bitstream of delta-sigma modulated sample data;

a link interface to send and receive data using a high-speed isochronous data link;

a clock circuit to generate a local clock signal;

a data storage element to store a sequence number associated with a time-stamp packet received over the link interface;

a counter clocked by the local clock signal to determine an offset time between receipt of the time-stamp packet and transmission of framed output data; and a framing controller to generate the framed output data for transmission over the isochronous data link, wherein the framed output data includes the sequence number, the offset time, and the delta-sigma modulated sample data, wherein the counter is to preload a value when resetting the offset time, and wherein the value includes propagation delay within the sampling device between receiving the time-stamp packet and resetting the offset time.

2. The sampling device claimed in claim 1, wherein the clock circuit comprises a phase-locked loop to perform clock recovery based on the isochronous data link to generate the local clock signal.

3. The sampling device claimed in claim 1, wherein the value further includes transmission delay in the sampling device between reading the offset value in the counter for insertion in the framed output data and transmission of the framed output data on the data link.

4. A sampling device for use in a distributed power measurement system, the sampling device comprising:

a delta-sigma modulator for sampling a power system quantity to generate a bitstream of delta-sigma modulated sample data;

a link interface to send and receive data using high-speed isochronous data links;

a clock circuit to generate a local clock signal;

a data storage element to store a sequence number associated with a time-stamp packet received over the link interface;

a counter clocked by the local clock signal to determine an offset time between receipt of the time-stamp packet and transmission of framed output data; and a framing controller to generate the framed output data for transmission over the isochronous data link, wherein the framed output data includes the sequence number, the offset time, and the delta-sigma modulated sample data, wherein the offset time comprises:
  a counter value from the counter,
  plus a first predetermined delay time between receipt of the time-stamp packet and starting of the counter,
  minus a predetermined delay between occurrence of a sampling event to reading of the counter value, and
  plus a second predetermined delay time between reading of the counter value and transmission of the framed output data.

5. The sampling device claimed in claim 4, wherein the sampling event comprises occurrence of a first sample in a series of samples contained in the bitstream.

6. The sampling device claimed in claim 1, wherein the framed output data includes a data payload containing an asynchronous data value regarding an event, and wherein the offset time comprises a time between receipt of the time-stamp packet and occurrence of the event.

7. The sampling device claimed in claim 1, wherein the isochronous link operates at at least 125 Mbps.

8. The sampling device claimed in claim 1, wherein the framed output data contains samples for multiple channels.

9. A distributed power measurement system comprising:

at least one sampling device, the sampling device including,
  a delta-sigma modulator for sampling a power system quantity to generate a bitstream of delta-sigma modulated sample data,
  a link interface to send and receive data using a high-speed isochronous data link,
  a clock circuit to generate a local clock signal,
  a data storage element to store a sequence number associated with a time-stamp packet received over the link interface,
  a counter clocked by the local clock signal to determine an offset time between receipt of the time-stamp packet and transmission of framed output data, and
  a framing controller to generate the framed output data for transmission over the isochronous data link, wherein the framed output data includes the sequence number, the offset time, and the delta-sigma modulated sample data,
  wherein the counter is to preload a value when resetting the offset time, and wherein the value includes propagation delay within the sampling device between receiving the time-stamp packet and resetting the offset time;

a master device connected to each of the at least one sampling devices via the high-speed isochronous data links to receive framed output data with associated sequence numbers and offset times, wherein the master device includes memory storing a plurality of time-stamp and sequence number pairs and a processor to determine an absolute time associated with data samples in the framed output data.

10. A master device for a distributed power measurement system to obtain power system sample data from a plurality of sampling devices distributed through the power measurement system, the master device comprising:

a GPS receiver to generate a high-speed clock signal to track absolute time;

a link interface to send and receive communications with the plurality of sampling devices over high-speed isochronous data links;

a signal processor to periodically send time-stamp packets to the plurality of sampling devices, each time stamp packet containing a time stamp based on the high-speed clock signal and being associated with a sequence number;

memory to store the associations between time stamps and sequence numbers;

wherein the signal processor is to receive framed output data from one of the sampling devices, the framed output data including delta-sigma modulated sample data of a power system quantity, one of the sequence numbers associated with a previously-sent time-stamp packet, and an offset time determined by said one of the sampling devices, and wherein the signal processor is to determine an absolute time associated with the delta-sigma modulated sample data based on the time stamp associated with said one of the sequence numbers and the offset time.

11. The master device claimed in claim 10, wherein the memory stores a transit time associated with communications between the master device and said one of the sampling devices, and wherein the signal processor is to determine the absolute time further based upon the transit time.

12. The master device claimed in claim 11, wherein the signal processor is to determine the transit time by transmitting a request message to said one of the sampling devices, receiving a response message in reply that contains a second offset value, and determining the transit time based on the elapsed time between sending the request message and receiving the response message, minus the second offset time.

13. The master device claimed in claim 10, wherein the sequence numbers are shorter in length than the time stamps.

14. The master device claimed in claim 10, wherein the memory stores a delay value associated with internal propagation delays within said one of the sampling devices, and wherein the signal processor is to determine the absolute time further based upon the delay value.

15. The master device claimed in claim 10, wherein the isochronous links operate at at least 125 Mbps.

16. The master device claimed in claim 10, wherein the framed output data contains samples for multiple channels.

17. The master device claimed in claim 10, wherein the GPS receiver further comprises a direct-digital synthesizer to generate the high-speed clock signal, with GPS-based correction.

18. The master device claimed in claim 10, wherein the offset time comprises a counter value clocked at a local clock signal on the sampling device, wherein the local clock signal is derived from one of the isochronous data links, and wherein the signal processor is to counter value to a time quantity based on the speed of the one of the isochronous links.

19. A sampling device for use in a distributed power measurement system, the sampling device comprising:

means for sampling a power system quantity to generate a bitstream of delta-sigma modulated sample data;

a link interface to send and receive data using a high-speed isochronous data link;

means for generating a local clock signal;

data storage means to store a sequence number associated with a time-stamp packet received over the link interface;

means to determine an offset time, clocked by the local clock signal, between receipt of the time-stamp packet and transmission of framed output data; and means to generate the framed output data for transmission over the isochronous data link, wherein the framed output data includes the sequence number, the offset time, and the delta-sigma modulated sample data, wherein the means to determine an offset time includes means to preload a value when resetting the offset time, and wherein the value includes propagation delay within the sampling device between receiving the time-stamp packet and resetting the offset time.

20. The sampling device claimed in claim 4, wherein the framed output data includes a data payload containing an asynchronous data value regarding an event, and wherein the offset time comprises a time between receipt of the time-stamp packet and occurrence of the event.

21. The sampling device claimed in claim 4, wherein the isochronous link operates at at least 125 Mbps.

22. The sampling device claimed in claim 4, wherein the framed output data contains samples for multiple channels.

* * * * *